United States Patent [19]

Mattei

[11] 3,980,873

[45] Sept. 14, 1976

[54] DIGITAL CONVOLUTIONAL FILTER

[75] Inventor: Anthony Mattei, Philadelphia, Pa.

[73] Assignee: Aeronutronic Ford Corporation, Dearborn, Mich.

[22] Filed: June 27, 1975

[21] Appl. No.: 591,229

[52] U.S. Cl. .............................. 235/156; 325/42; 328/167
[51] Int. Cl.² ...................... G06F 7/38; G06F 15/34
[58] Field of Search ............ 235/156, 152; 328/167; 333/18, 28, 70 T; 325/42, 65

[56] References Cited
UNITED STATES PATENTS

| | | | |
|---|---|---|---|
| 3,639,848 | 2/1972 | Elliott | 328/167 |
| 3,665,171 | 5/1972 | Morrow | 235/156 X |
| 3,679,882 | 7/1972 | McAuliffe | 235/156 |
| 3,703,632 | 11/1972 | Shanks | 328/167 X |
| 3,732,409 | 5/1973 | Zohar | 328/167 X |

Primary Examiner—Joseph F. Ruggiero
Attorney, Agent, or Firm—Robert W. Brown; Keith L. Zerschling

[57] ABSTRACT

A digital linear phase shift convolutional filter for filtering a series of binary number electrical signals each of which represents the magnitude of a sample of an analog electrical signal sampled at a predetermined rate. The convolutional filter utilizes a bidirectional shift register and a preferably unidirectional shift register. Each of the registers has a plurality of stages. The bidirectional shift register receives the serially presented binary number electrical signals representative of the sample magnitudes, and these samples are sequentially transferred from the output stage of the bidirectional shift register to the input stage of the unidirectional shift register. During the interval between receipt in the bidirectional shift register of binary number electrical signals representative of the sample amplitudes, the binary number electrical signals stored in the bidirectional shift register are shifted in a recirculating fashion, as are the binary number electrical signals stored in the unidirectional shift register. The binary number electrical signals appearing in particular stages of each of the registers are combined arithmetically to produce a resultant binary number electrical signal with each shift in the recirculating shift registers. These resultant signals are multiplied by constant values representing filter weights, and the products are summed to produce an output binary number electrical signal. One such output signal is produced for each new sample that enters the bidirectional shift register.

6 Claims, 5 Drawing Figures

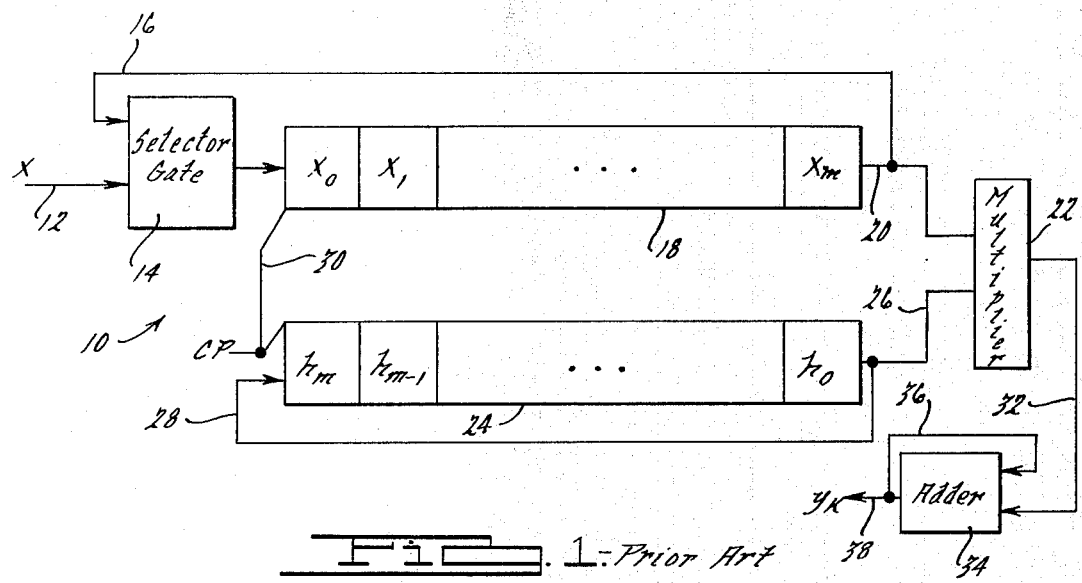
FIG. 1.—Prior Art
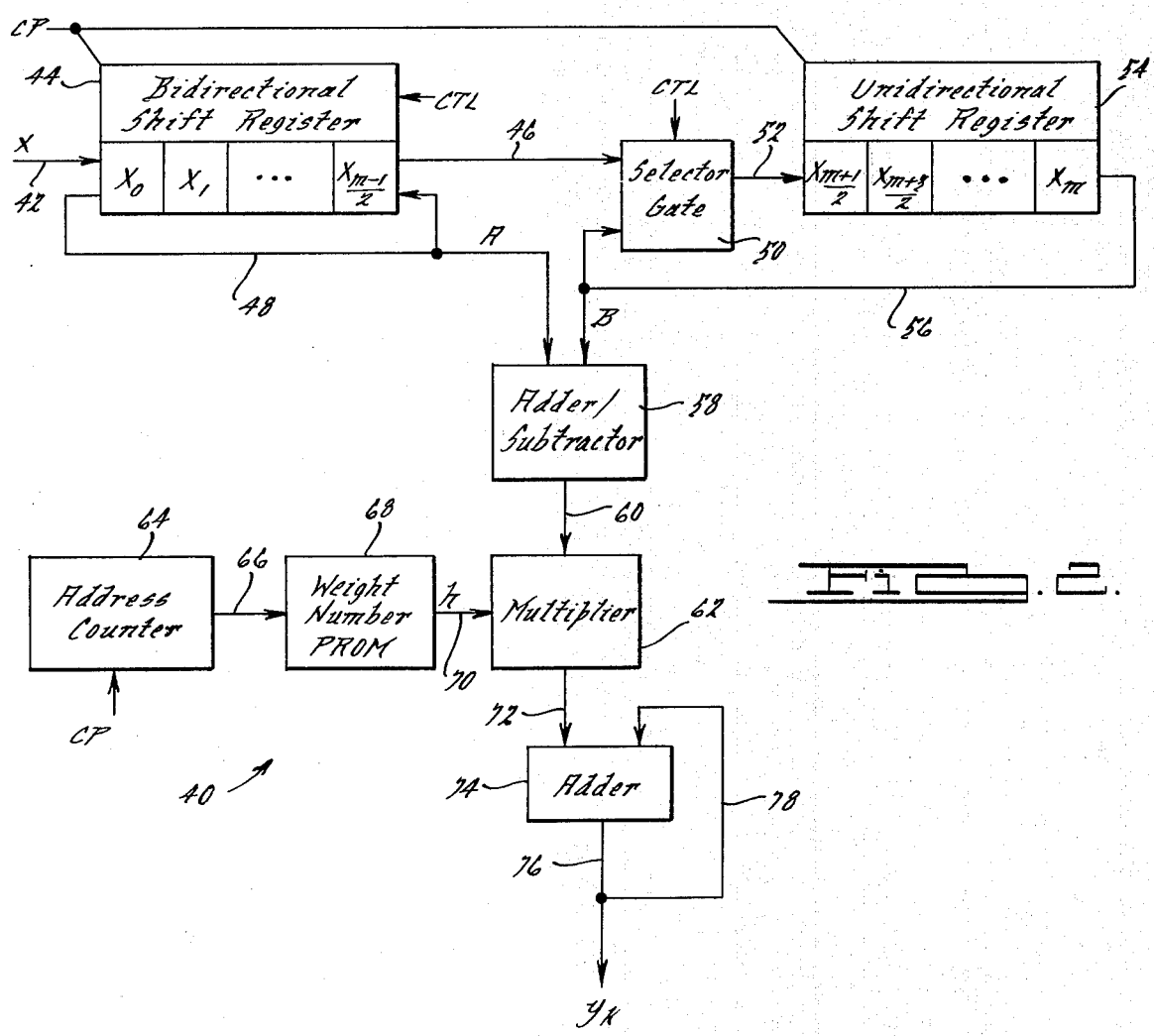
FIG. 2.

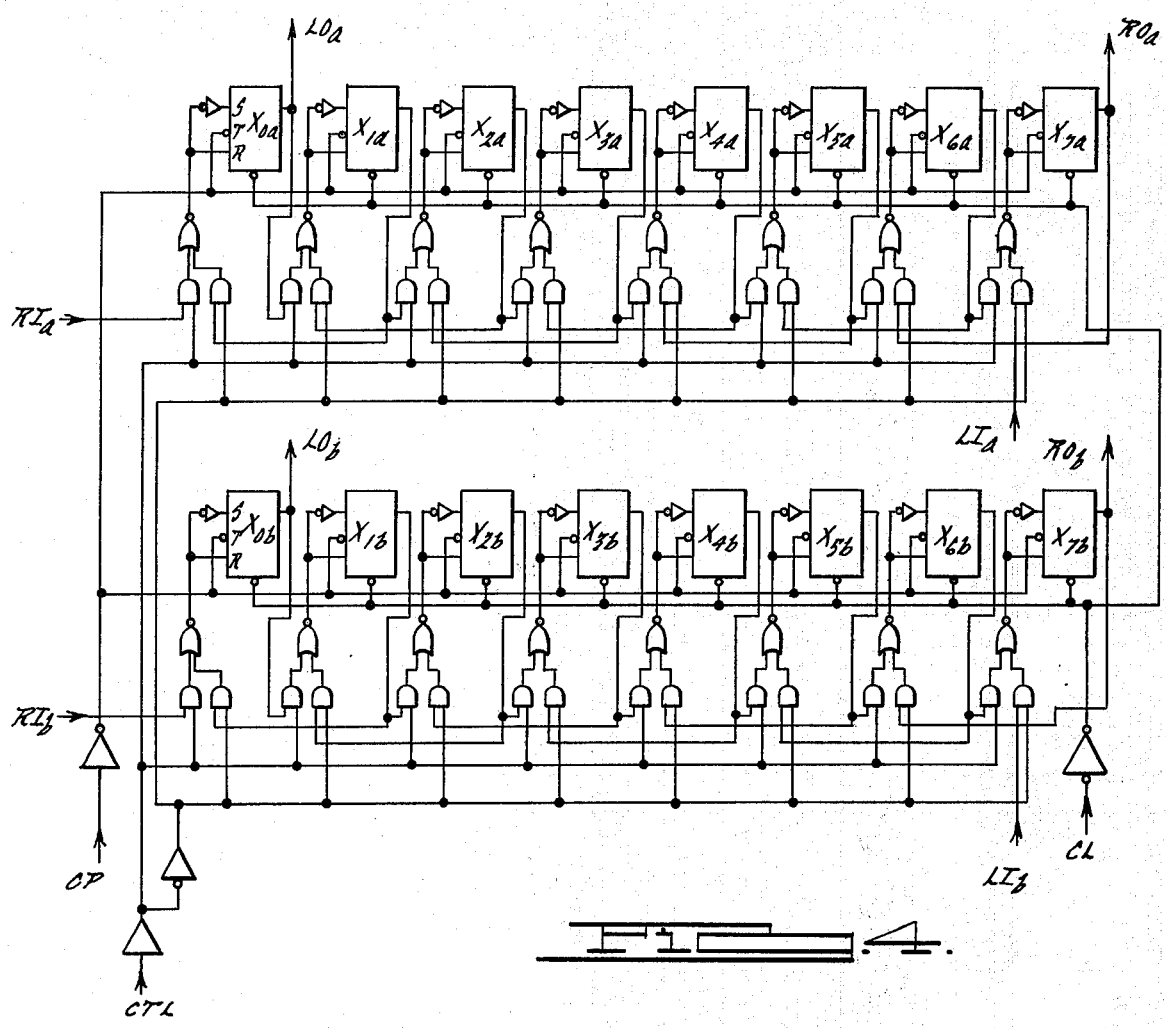
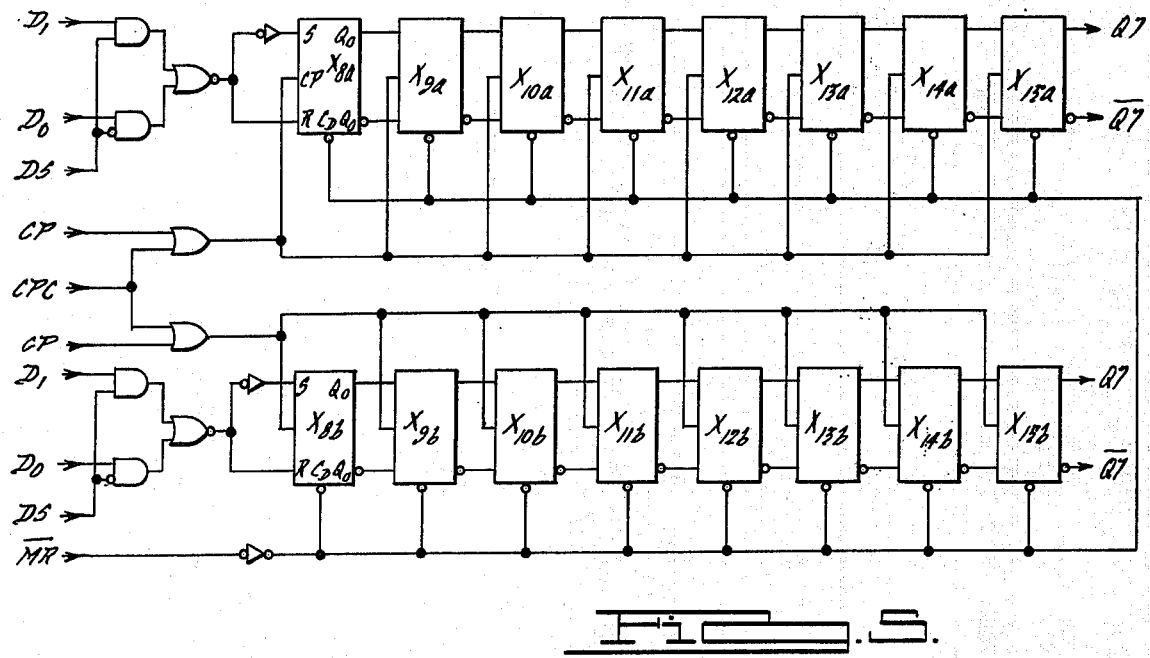

DIGITAL CONVOLUTIONAL FILTER

BACKGROUND

The invention herein described was made in the course of or under a contract or subcontract thereunder, (or grant) with the Department of the Air Force.

This invention relates to a digital linear-phaseshift convolutional filter for filtering a series of binary number electrical signals, each binary number electrical signal representing the amplitude of a sample of an analog electrical signal sampled at a predetermined rate.

Generally, all communications systems of electronic character require filtering of the electrical waveforms present in the communication system. Except in those situations wherein it is desired to remove previously introduced distortions of a signal with a non-linear phase filter equalizer, it is generally desired to provide an ideal filter in which the input electrical signal, over the passband of interest, appears at the output of the filter with an amplitude which is constant and with a phase shift which is a linear function of the frequency content of the input electrical signal. In practice, a filter which does not attenuate the input signal to produce amplitude distortion is very difficult, if not impossible, to obtain. However, a filter which has linear phase shift and desirable sharp cutoff at the upper and lower frequency limits of the passband can be obtained.

The ideal filter described in the preceding paragraph can be closely approximated in a digital convolutional filter. With a filter of this kind, an analog electrical signal is sampled at a predetermined rate to generate binary number electrical signals representing the amplitudes of the samples of the analog electrical signal. In a manner analogous to a transversal filter utilized in analog filtering systems, the binary number electrical signals representative of the sample amplitudes are multiplied by weight numbers stored in a memory, these weight numbers being analogous to the tap weights of a transversal filter in an analog system. For each sample presented at the input of the digital filter, an output binary number electrical signal is generated. This generated output binary number electrical signal has an amplitude determined by the summation of the products produced by multiplying previous sample values by the weight numbers stored in the memory.

In a digital filter of the kind described above, the filtering operation is performed utilizing a predetermined number of the input binary number electrical signals representing samples of the analog electrical signal. Usually, these binary number sample values are stored in a shift register which is updated by the introduction of a new sample as it appears at the filter input. When the new sample value is introduced into the shift register, the oldest of the stored sample valve is discarded. In a linear-phase-shift digital filter, the weight numbers stored in the memory necessarily are symmetrical about a central value, where an odd number of weight numbers is utilized. Where an even number of weight numbers is utilized, they are symmetrical in the sense that for each weight number there is a second and corresponding weight number which is utilized by the digital filter. The symmetry of the weight numbers may be even or odd; for even symmetry, for every weight number $h = F(A)$, there exists a corresponding weight number $h = f(-A)$. For odd symmetry, for every weight number $h = f(-A)$, there exists a corresponding weight number $-h = f(-A)$.

The present invention utilizes the symmetry of the weight numbers in a digital linear-phase-shift convolutional filter to reduce the number of binary number electrical signal multiplications required by prior art convolutional filters, thereby, either to reduce the number of multipliers required in the electronic circuitry or to reduce the required computation time. Moreover, the invention reduces the electronic hardware requirements and lowers the electronic system power requirements. Furthermore, the number of filter weight numbers required to be stored in the filter memory may be reduced or the number of logic control elements required to select the weight numbers may be reduced.

The following U.S. Pat. Nos. are illustrative of the prior art: 2,980,871 to Cox; 3,315,171 to Becker; 3,639,848 to Elliott; and 3,717,756 to Stitt.

SUMMARY OF THE INVENTION

In accordance with the invention, a digital convolutional filter for filtering a series of binary number electrical signals is provided. Each binary number electrical signal represents the magnitude of a sample of an analog electrical signal which is sampled at a predetermined rate. The digital convolution filter comprises a bidirectional shift register having an input stage supplied with the series of binary number electrical signals and an output stage coupled to the input stage to permit shifting of binary number electrical signals from the input stage to the output stage. A second shift register has an input stage coupled to the output stage of the bidirectional shift register to permit shifting of binary number electrical signals in the output stage of the bidirectional shift register toward or into the input stage of the second shift register. The output stage of the second shift register is coupled to its input stage to permit shifting of binary number electrical signals in the output stage of the second shift register toward or into the input stage thereof. Means are provided for combining a binary number electrical signal in the input stage of the bidirectional shift register with a binary number electrical signal in the output stage of the second shift register.

The stages of the bidirectional and second shift registers are filled progressively by the binary number electrical signals representative of sample magnitudes presented serially at the input stage of the bidirectional shift register. Although filtering of the input sample signals occurs immediately, the various stages of the shift registers are not filled with binary number electrical signals representing sample magnitudes until a number of samples equal to the utilized register stages has appeared at the input to the bidirectional shift register. Once, this has occurred, each new binary number input signal representative of a sample value presented at the input of the bidirectional shift register causes all of the stored binary number electrical signals to shift to an adjacent register and the binary number electrical signal in the output stage of the second shift register is discarded.

During the time interval between the occurrence of consecutive binary number electrical signals representative of sample amplitude appearing at the input stage of the bidirectional shift register, the binary number electrical signals stored in the shift registers are convolved or shifted in a progressively recirculating manner. Each binary number electrical signal appearing in the input stage of the bidirectional shift register is combined with the binary number electrical signal concurrently appearing in the output stage of the second shift register.

This arithmetic combination is formed for each shift of the registers and the resultant binary number electrical signal appearing after each shift is multiplied by a weight number selected from a memory. Each binary number electrical signal in the registers is shifted a number of times required to return it to its original stage, while the products, produced by each multiplication of a weight number and a resultant binary number electrical signal from the combining circuit are summed to generate at the end of the convolution an output amplitude equal to the sum of the products. If a center weight number is utilized, a product utilizing this center weight number may be summed with the other products at any time between occurrences of the consecutive sample values at the input stage of the bidirectional shift register.

The invention may be better understood by reference to the detailed description which follows and to the drawings.

BRIEF DESCRIPTION OF THE DRAWINGS

FIG. 1 is a schematic electric diagram of a convolution filter of the prior art;

FIG. 2 is a schematic electrical diagram of a digital linear-phase-shift convolution filter in accordance with the invention;

FIG. 4 is a detailed schematic electrical diagram of the preferred embodiment of a bidirectional shift register illustrated in lesser detail in FIGS. 2 and 3; and FIG. 5 is a detailed schematic electrical diagram of a commercially available unidirectional shift register having a selector gate as an integral part thereof.

DETAILED DESCRIPTION

Figure 3:
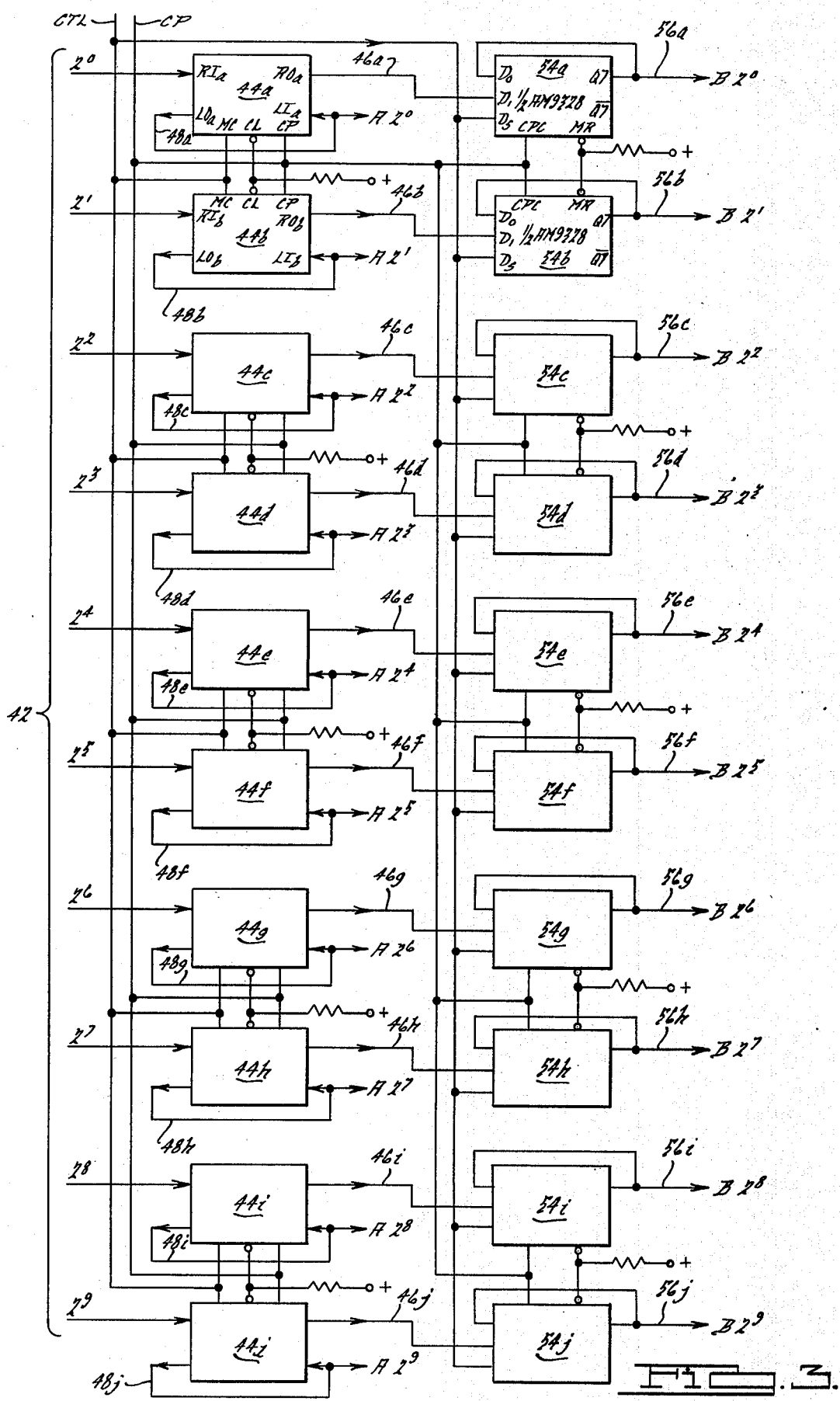
FIG. 3 is a schematic electrical diagram of a bidirectional shift register, selector gate and unidirectional shift register illustrated in block form in FIG. 2.

With reference now to the drawings, wherein like numerals and designations refer to like elements in the several views, there is shown in FIG. 1 a schematic diagram of a prior art digital convolutional filter. This convolutional filter, generally designated by the numeral 10, has an input 12 supplied binary number electrical signals representative of the amplitude of samples of an analog electrical signal. These samples, $x$ are presented at the input 12 in a serial manner, that is, at spaced intervals due to the sampling of the analog signal at a predetermined rate.

The input 12 is supplied to a selector gate 14 which has a second input 16 obtained from the output stage $x_m$ of a typically unidirectional shift register 18. The output stage $x_m$ also has its output 20 coupled to a multiplier 22. The shift register 18 has $(m + 1)$ stages identified as $x_0$ through $x_m$, and binary number electrical signals in each of these stages may be progressively shifted from the left to the right as viewed in FIG. 1.

A second shift register 24 has stages $h_m$ through $h_0$, again a total of $(m + 1)$ stages. The output 26 of the $h_0$ stage is coupled to the multiplier 22, and also forms an input 28 to the $h_m$ stage.

The circuit of FIG. 1 is a digital circuit implementation of a convolutional filter that performs calculations dictated by the equations $$y_k = \sum_{i=0}^{m} x_{m-i} h_i \qquad (1)$$

where $y_k$ is the output sample corresponding to $(m + 1)$ past samples of the input samples $x$. For each new sample $x$, a new corresponding value $y_k$ is calculated with the circuitry of FIG. 1 utilizing the summation process dictated by equation (1) above.

In the FIG. 1 circuit, let it be assumed that each of the stages $x_0$ through $x_m$ of the shift register 18 contains a binary number electrical signal corresponding to a past sample $x$ of the input to be filtered. The input samples $x$ first enter the $x_0$ input stage and are progressively transferred, as a result of the supply of clock pulses cp to the shift register 18, from one stage to the next from left to right. During the interval between the occurrences of input samples at the input 12 of the selector gate 14, the selector gate is connected such that the input 16 thereto is connected to the input stage $x_0$ of the shift register 18. Clock pulses CP are supplied on lead 30 to each of the shift registers 18 and 24. A first clock pulse causes the binary number electrical signals in the stages $x_m$ and $h_0$ to be entered into the multiplier 22 to produce a product $x_m h_0$. At this time, the binary number electrical signal transferred to the multiplier from the $x_m$ stage of shift register 18 is transferred, via the input lead 16 and selector gate 14, to the $x_0$ stage and the binary number electrical signal previously in the $x_0$ stage is transferred to the $x_1$ stage. Also, the binary number electrical signal that will have been in the $x_{m-1}$ stage is transferred into the $x_m$ stage. Similarly, the binary number electrical signal representative of a filter weight number in the $h_0$ stage is transferred into the multiplier 22 and, via input 28, to the $h_m$ stage, subsequent to transfer of the binary number electrical signal previously contained in the $h_m$ stage to the $h_{m-1}$ stage.

Successive clock pulses applied to lead 30 result in shifts of the binary number electrical signals from left to right in the registers 18 and 24. Thus, the multiplier 22 produces the products $h_0 x_m$, $h_1 x_{m-1}$, etc. For each clock pulse on lead 30, one such product is formed in the multiplier 22 and is supplied as an input 32 to an adder 34. The adder 34 has a feedback lead 36 connected to its output 38 so that the adder acts as an accumulator to store the sum of the products appearing at the output 32 of the multiplier 22. The products are accumulated until the binary number electrical signal $x_m$ originally stored in the $x_m$ stage of the shift register 18 has passed through the $x_0$ stage and returned to the $x_m$ stage. Similarly, the binary number electrical signal $h_0$ originally stored in the $h_0$ stage of shift register 24 will have passed from the $h_m$ stage and returned to the $h_0$ stage. The weight numbers in the register 24 then are available for reuse. The output sample $y_k$ appearing on output lead 38 of the adder 34 is a binary number electrical signal representing the value of a single output sample from the convolutional filter 10 and corresponds to m+1 past samples of the input $x$.

In a linear-phase-shift convolutional filter, the weight numbers in the shift register 24 are symmetrical. For odd symmetry, $m$ is an even number and there are $(m+1)$ stages in the shift register 24. The center stage would be designated $h_{m/2}$ and typically would have a weight number of 1. The weight numbers in the stages adjacent the center stage would be equal, and the weight number in the second stage to the left of the center stage would be the same as the weight number in the second stage to the right of the center stage, etc. Thus, it is possible to reduce the number of multiplications, in accordance with the invention, by combining, by addition or subtraction, the binary number electrical signals initially in the stages $x_0$ and $x_m$ and multiplying the result by the weight number $h_0$ to produce a first product, then by combining the binary number electrical signals $x_1$ and $x_{m-1}$ and multiplying the result by $h_1$ to produce a second product, etc., and by summing in the adder 34 these products to obtain the sample value $y_k$ as the filter output.

After a sample $y_k$ is formed, the adder 34 is cleared and a new input binary number electrical signal appears on input 12 of the selector gate, which couples this input to the $x_0$ stage to enter a new binary number electrical signal therein. The binary number electrical signal previously stored in the output stage $x_m$ is discarded and a new sample $y_k$ is generated by the convolution technique described above.

According to the invention, a digital linear-phase-shift convolutional filter is provided for determining binary number electrical signals $y_k$ corresponding to $(m + 1)$ past samples of a binary number electrical signal representative of samples of an analogue electrical signal. The signals $y_k$ are digitally calculated using either an odd number or even number of filter weight numbers and either even or odd symmetry of the weight numbers according to the following equations:

For an even number of weight numbers ($m$ odd) and even symmetry:

$$y_k = \sum_{i=0}^{(m-1)/2} h_i (X_i + X_{m-i}) \quad (2)$$

For an even number of weight numbers ($m$ odd) and odd symmetry:

$$y_k = \sum_{i=0}^{(m-1)/2} h_i (X_i - X_{m-i}) \quad (3)$$

or $$y_k = \sum_{i=0}^{(m-1)/2} h_i (X_{m-i} - X_i) \quad (4)$$

For an odd number of weight numbers ($m$ even) and even symmetry:

$$y_k = h_{m/2} X_{m/2} + \sum_{i=0}^{(m/2)-1} h_i (X_i + X_{m-i}) \quad (5)$$

For an odd number of weight numbers ($m$ even) and odd symmetry:

$$y_k = h_{m/2} X_{m/2} + \sum_{i=0}^{(m/2)-1} h_i (X_i - X_{m-i}) \quad (6)$$

or $$y_k = h_{m/2} X_{m/2} + \sum_{i=0}^{(m/2)-1} h_i (X_{m-i} - X_i) \quad (7)$$

The circuit illustrated schematically in FIG. 2 is capable of performing the electronic digital calculations dictated by equations 2, 3 and 4 above, and may easily be modified as hereinafter described to perform the digital calculations dictated by equations 5, 6 and 7.

With particular reference now to FIG. 2, binary number electrical signals representative of samples of an analogue electrical signal are supplied on an input 42 to a bidirectional shift register 44 having a control input CTL. The shift register 44 has stages $X_0$ to $X_{(m-1)/2}$. Each of these stages stores a past sample of a binary number electrical signal $x$, the $X_0$ stage storing the most recent sample value $x$ and the stage $X_{(m-1)/2}$ storing the $(m-1)/2$ past sample of the samples $X$. The signal applied to the control line determines whether the binary number electrical signals stored in the stages are shifted from the left toward the right or from the right toward the left. When the bidirectional shift register 44 is shifting from right to left, the binary number electrical signals shifted progressively out of the $x_0$ stage are shifted through line 48 to the $X_{(m-1)/2}$ stage to recirculate or convolute the stored numbers. They also are supplied during such shifts to an adder/subtractor 58 as an input signal A thereto. When the bidirectional shift register 44 is shifting from left to right, a new sample value $x$ enters the $x_0$ stage and the binary number electrical signal stored in the $x_{(m-1)/2}$ stage is shifted out of the register 44 via line 46 and into a selector gate 50. The selector gate 50 has the control line CTL and an output line 52. The output line 52, during left to right shifts of the bidirectional shift register 44, is coupled to the line 46 and the binary number electrical signal thus is transferred into the $X_{(m+1)/2}$ input stage of a preferably unidirectional shift register 54.

The unidirectional shift register 54 has stages $X_{(m+1)/2}$ through $x_m$ and has an output line 56 coupled to the $x_m$ stage thereof and to a second input to the adder/subtractor 58. On this input, binary number electrical signals B appear.

The adder/subtractor 58 has an output 60 that forms one input to a multiplier 62. An address counter 64, controlled by clock pulses CP, generates an output address on line 66 that is applied to a weight-number programmable-read-only memory 68. The weight number h on the output line 70 of the memory 68 forms a second input to the multiplier 62. The products produced by the multiplier 62 are supplied via output leads 72 to an adder 74, which has an output 76 at which the binary number electrical signals $y_k$ appear. A line 78 interconnects the output line 76 with an input to the adder 74, thereby connecting the adder 74 as an accumulator which sums any output numbers on line 76 with binary number electrical signals appearing at its input 72. At the end of a calculation of a sample value $y_k$, the adder 74 is cleared.

In the description which follows for the operation of a circuit of FIG. 2, it is assumed that the circuit is performing the digital calculations dictated by equation (2) above and that the adder/subtractor 58 is connected to combine the binary number electrical signals A and B as an arithmetic addition process. Moreover, it is assumed that at least $(m + 1)$ past samples of the signal $x$ have occurred so that all of the stages of the bidirectional shift register 44 and unidirectional shift register 54 contain binary number electrical signals.

Upon the occurrence of a new sample $x$ on the line 42, this sample is entered into the $x_0$ stage of the bidirectional shift register 44 and each of the binary number electrical signals previously stored therein are shifted from left to right. The binary number electrical signal previously stored in the $X_{(m-1)/2}$ stage is shifted into the $X_{(m+1)/2}$ stage of the unidirectional shift register 54. The previously held binary number electrical signal in the $x_m$ stage of the register 54 is discarded.

Subsequent to this entry of a new sample into the bidirectional shift register 44 and shifting of the previous signals from left to right, and during the interval between this new sample and the next sample, the signal on the control lines CTL is altered so that output 52 of the selector gate 50 is connected to the line 56 and the bidirectional shift register 44 is set to shift from right to left. Each clock pulse CP supplied to the shift registers 44 and 54 causes a shift that performs the summation and multiplication dictated by equation (2) above. In this connection, the equation subscripts for the symbols $h$ and $x$ in equation (2) designate the binary number electrical signal contents of the corresponding subscript designated stages in the shift registers 44 and 54 as of a time immediately after entry of a new sample value $x$ from line 12 into the bidirectional shift register 44. Also, when the bidirectional shift register 44 is set to shift from right to left, the register also is set to transfer the signal in $x_0$ stage into the $X_{(m-1)/2}$ stage via line 48.

When the bidirectional shift register is set to shift from right to left, the next clock pulse transfers the $x_0$ binary number electrical signal into the adder 58 as its input A and the binary number electrical signal $x_m$ into the adder 58 as its input B. On line 60, the sum $(x_0 + x_m)$ is produced and is applied as one input to the multiplier 62.

The digital convolutional filter, generally designated by the numeral 40, may perform a variety of circuit filtering operations simply by the use of a different set of weight numbers $h$ appearing at output line 70 of the memory 68. The set of weight numbers h selected from the memory 68 is determined by the address counter 64. The address appearing on the output line 66 of this counter, after the entry of a new sample $x$ into the shift register 44, is a starting address associated with a set of weight numbers of constants $h$. The starting address determines the weight number $h_0$ selected from the memory and each successive clock pulse CP supplied to the counter 64 changes the address appearing on line 66 and produces weight numbers $h_1$, $h_2$, etc., on the output line 70 of the memory.

When the sum $(x_0 + x_m)$ appears at the output line 60 of adder 58, the weight number $h_0$ appears at the line 70 forming a second input to the multiplier 62. The product $h_0 (x_0 + x_m)$ then appears at the output line 72 of the multiplier and is accumulated in the adder 74.

Upon the occurrence of the next clock pulse CP, the bidirectional shift register 44 shifts from right to left and the unidirectional shift register shifts from left to right so that the input signals A and B to the adder are, respectively, $x_1$ and $X_{m-1}$. These values are combined to produce the sum $(x_7 + X_{m-1})$, which sum appears on the output line 60 of the adder 58 and is multiplied in the multiplier 62 by the weight number $h_1$ derived from the memory 68. The resulting product $h_1 (X_1 + X_{m-1})$ is accumulated in the adder 74 with the previous product $h_0 (X_0 + X_m)$ supplied thereto. The process continues until the product $$h_{\frac{m-1}{2}} \left( \frac{X_{m-1}}{2} + \frac{X_{m+1}}{2} \right)$$

is formed and accumulated with the other products in the adder 78. The result is a sample value $y_k$, a filtered binary number electrical signal sample value corresponding to $(m + 1)$ past samples of input samples $x$, appears on the output line 76.

Were the circuitry of FIG. 2 to be utilized as a convolutional filter for odd symmetry of the weight numbers, as dictated by equations (3), (4), (6) and (7) above, the adder/subtractor 58 may be utilized as a subtractor. Also, where the calculations dictated by equations (5), (6) and (7) are to be digitally performed, provision must be made in the circuit for summing the term $h_{m/2} x_{m/2}$ in these equations with the products accumulated during the convolutional steps described in the preceding paragraphs. For this purpose, a set of type-D flip-flops or other storage register means may be inserted in the line 46 to store the binary number electrical signal $x/m/2$. If the weight number $h_{m/2}$ is unity, as normally is the case, then no multiplier is required and the binary number electrical signal $x_{m/2}$ may be accumulated in the adder 74 at any time during the interval between incoming sample values $x$.

With particular reference now to FIG. 3, there is shown a more detailed schematic electrical diagram of the interconnections of the bidirectional shift register 44 and unidirectional shift register 54 of FIG. 2. As illustrated in FIG. 3, the binary number electrical signals $x$ are assumed to be of 10 bits per sample or word so that each sample $x$ has bits representing powers of 2 from $2^0$ to $2^9$ that are applied to the circuit input lines in FIG. 3 designated according to such powers and collectively designated as the line 42.

Each of the bits of the input samples $x$ are supplied, respectively, to shift registers 44a through 44j. The outputs 46a through 46j of the bidirectional shift registers 44a through 44j are applied to the preferably unidirectional shift registers 54a through 54j, each of which may be one-half of a type AM9328 dual shift register commercially available from Advanced Micro Devices, Inc., Sunnyvale, Calif. The AM9328 shift register is a dual eight-bit shift register and, therefore, five of the dual packages are required to accommodate the 10-bit word length.

In FIG. 4, there is shown a detailed schematic electrical diagram of a dual eight-bit bidirectional shift register. Five of these dual bidirectional shift registers are required for the implementation illustrated in FIG. 3, one dual shift register being required for every two bits of the binary number input signal 42. In FIG. 4, the input and output subscripts a and b correspond, respectively, to the inputs and outputs of the shift registers 44a and 44b shown in FIG. 3.

When the control line CTL has a logic one applied to it, the bidirectional shift registers shift from left to right, and when the logic zero is applied to the control line CTL, the bidirectional shift registers shift from right to left.

The flip-flops have an input $RI_a$ and an output $RO_a$. Upon the occurrence of a clock pulse at the CP input of the shift registers, a data bit appearing at the $RI_a$ input is entered into an RS flip-flop $x_{0a}$ and the data bit previously contained therein is shifted to the right, that is, into the $X_{1a}$ flip-flop. Similarly, a data bit at the $RI_b$ input is entered into the $x_{0b}$ flip-flop and the data bits in the various flip-flops are shifted to the right. The data bits in the $x_{7a}$ and $x_{7b}$ flip-flops are transferred, respectively, via output leads $RO_a$ and $RO_b$ to the unidirectional shift registers 54a and 54b. These leads $RO_a$ and $RO_b$ correspond, respectively, to the leads 46a and 46b in FIG. 3.

When the control line CTL is set at a logic zero condition, the data bits appearing at the $LI_a$ and $LI_b$ inputs to the flip-flop $x_{7a}$ and $x_{7b}$ are entered therein, and the bits previously in these flip-flops are shifted to the left. The bits shifted out of the $x_{0a}$ and $x_{0b}$ flip-flops are, respectively, the data bit inputs appearing at input terminals $LI_a$ and $LI_b$, due to the interconnection of the $LO_a$ and $LI_a$ terminals by the lead 48a and the interconnection of the $LO_b$ and $LI_b$ terminals by the lead 48b. Thus, during right to left shifts, the data bits are recirculated from one end of a shift register to the other.

The bidirectional shift registers 44a through 44j may be replaced by a type SN 74198 eight-bit bidirectional shift register commercially available from Texas Instruments, Inc. This commercial circuit, or the equivalent available from other manufacturers, has parallel input and output, a feature not required by the present implementation.

In the unidirectional shift registers 54a through 54j, the control line signal CTL applied to the $D_s$ input thereof, and also applied to the mode control MC inputs of the bidirectional shift registers 44a through 44j, determines whether the data bit appearing at input terminal $D_1$ or at input terminal $D_O$ is entered into the $X_O$ stage of the shift register. If the control signal CTL is a logic one, the data bit appearing at input $D_1$ is entered into the shift register. If the control signal CTL is a logic zero, then the data bit appearing at the $D_o$ input is entered into the shift register.

With respect to the bidirectional shift registers, 44a through 44j, the data bits of the electrical signal A are obtained at the common connection between the LI and LO terminals. The data bits of the electrical signal B are obtained from the common connection of the Q7 and $D_O$ terminals of the shift registers 54a through 54j. Of course, the electrical signals A and B are applied as the inputs to the adder/subtractor 58 where the signals A and B are combined as required by the dictates of the calculations being performed in accordance with the equations (2) through (7).

Based upon the foregoing description of the invention, what is claimed is:

1. A digital convolutional filter for filtering a series of binary number electrical signals, each binary number electrical signal representing the amplitude of a sample of an analog electrical signal which is sampled at a predetermined rate, said digital convolutional filter comprising:

a bidirectional shift register having an input stage to be supplied with said series of binary number electrical signals and having an output stage coupled to said input stage to permit shifting of a binary number electrical signal in said input stage toward or into said output stage;

a second shift register having an input stage coupled to said output stage of said bidirectional shift register to permit shifting of a binary number electrical signal in said output stage of said bidirectional shift register toward or into said input stage of said second shift register, said output stage of said second shift register being coupled to said input stage of said second shift register to permit shifting of a binary number electrical signal in said output stage of said second shift register toward or into said input stage thereof;

means for combining a binary number electrical signal in said input stage of said bidirectional shift register with a binary number electrical signal in said output stage of said second shift register;

means for storing or generating a plurality of binary number electrical signals representative of constants;

means for multiplying a binary number electrical signal, representative of a constant selected from said means for storing or generating a plurality of binary number electrical signals representative of constants, by a binary number electrical signal produced by said combining means, said multiplying means thus producing a product binary number electrical signal; and means for summing product binary number electrical signals produced by said multiplying means.

2. A digital convolutional filter according to claim 1 which includes circuit means for causing said series of binary number electrical signals to shift progressively through said bidirectional shift register from said input stage thereof toward said output stage thereof.

3. A digital convolutional filter according to claim 2 which includes circuit means for causing, in the time interval between consecutive binary number electrical signals representing the magnitude of samples of said analog electrical signal, the binary number electrical signals stored in the stages of said bidirectional shift register to shift progressively from said output register thereof toward said input register thereof with binary number electrical signals in said input register thereof being shifted to said output register thereof and for simultaneously causing binary number electrical signals in said input stage of said second shift register to be shifted progressively toward said output stage of said second shift register with binary number electrical signals in said output stage of said second shift register being shifted to said input stage of said second shift register.

4. A digital convolutional filter for filtering a series of binary number electrical signals, each binary number electrical signal representing the amplitude of a sample of an analog electrical signal which is sampled at a predetermined rate, said digital convolutional filter comprising:

bidirectional shift register means, having a plurality of stages for storing a plurality of said binary number electrical signals and for progressively shifting, in first and second directions, said binary number electrical signals from stage to stage;

means for causing said bidirectional shift register progressively to shift binary number electrical signals from stage to stage therein in said first direction upon the occurrence of one of said binary number electrical signals representing the magnitude of a sample of said analog electrical signal and for causing said bidirectional shift register to shift binary number electrical signals in said stages thereof in said second direction during the time interval between the occurrence of consecutive binary number electrical signals representative of the magnitude of samples of said analog electrical signal;

a second shift register, having a plurality of stages, for storing a plurality of said binary number electrical signals;

means for combining arithmetically a binary number electrical signal in one of said stages of said bidirectional shift register with a binary number electrical signal in one of said stages of said second shift register to produce a resultant binary number electrical signal;

means for storing or generating a plurality of binary number electrical signals representative of constants;

means for multiplying arithmetically one of said constant binary number electrical signals, selected from said means for storing or generating, by said resultant binary number electrical signal; and means, coupled to said multiplying means, for summing arithmetically binary number electrical signals representative of products generated by said multiplying means.

5. A digital convolutional filter according to claim 4 wherein said second shift register has an input stage and an output stage and wherein said digital convolutional filter includes means for causing, upon the occurrence of a binary number electrical signal representing the magnitude of a sample of said analog electrical signal, a binary number electrical signal from said bidirectional shift register to be shifted into said input stage of said second shift register and for causing, during the interval between consecutive binary number electrical signals representing the magnitudes of samples of said analog electrical signal, binary number electrical signals in said stages of said second shift register to be shifted in a direction from said input stage thereof to said output stage thereof with the binary number electrical signals occurring in the output stage of said second shift register being shifted to the input stage thereof.

6. A digital convolutional filter for filtering a series of binary number electrical signals, each binary number electrical signal representing the amplitude of a sample of an analogue electrical signal which is sampled at a predetermined rate, said digital convolutional filter comprising:

a bidirectional shift register having a plurality of stages including an input stage and an output stage, each of said stages being capable of storing one of said binary number electrical signals and said bidirectional shift register being capable of shifting a binary number electrical signal progressively from stage to stage in a first direction from said input stage toward said output stage and in a second direction from said output stage toward said input stage;

a second shift register having a plurality of stages including an input stage and an output stage, each of said stages being capable of storing one of said binary number electrical signals and said second shift register being capable of shifting a binary number electrical signal in a direction from its input stage toward its output stage;

selector gate means having a first input coupled directly or indirectly to said output stage of said bidirectional shift register, a second input coupled to said output stage of said second shift register and an output coupled to said input stage of said second shift register for coupling said first input to said selector gate means output or said second input to said selector gate means output;

means for combining arithmetically a binary number electrical signal in said input stage of said bidirectional shift register with a binary number electrical signal in said output stage of said second shift register;

memory means for storing a plurality of binary number electrical signals, each being representative of a constant;

means, coupled to said memory means and to said combining means, for multiplying binary number electrical signals representative of constants stored in said memory means by binary number electrical signals derived from said output of said summing means, thereby, to produce product binary number electrical signals; and means, coupled to said multiplying means, for summing said product binary number electrical signals.

* * * * *